United States Patent
Lin et al.

(10) Patent No.: US 8,170,818 B2
(45) Date of Patent: May 1, 2012

(54) BATTERY STATE ESTIMATOR USING MULTIPLE SAMPLING RATES

(75) Inventors: Jian Lin, Beverly Hills, MI (US);
Xidong Tang, Sterling Heights, MI (US); Brian J. Koch, Berkley, MI (US);
Mark W. Verbrugge, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 226 days.

(21) Appl. No.: 12/721,368

(22) Filed: Mar. 10, 2010

(65) Prior Publication Data
US 2011/0224928 A1    Sep. 15, 2011

(51) Int. Cl.
*G01R 31/36* (2006.01)
(52) U.S. Cl. ......................................................... 702/63
(58) Field of Classification Search ...................... 702/63
See application file for complete search history.

(56) References Cited

U.S. PATENT DOCUMENTS

| | | | |
|---|---|---|---|
| 2003/0184307 A1* | 10/2003 | Kozlowski et al. | 324/427 |
| 2009/0023053 A1 | 1/2009 | Berdichevsky et al. | |
| 2009/0091299 A1 | 4/2009 | Lin et al. | |

* cited by examiner

*Primary Examiner* — Drew A Dunn
*Assistant Examiner* — Stephen Cherry
(74) *Attorney, Agent, or Firm* — John A. Miller; Miller IP Group, PLC

(57) ABSTRACT

A method for estimating vehicle battery parameters that uses two different sampling rates. The method samples a battery terminal voltage and current at a high sampling rate to estimate the battery open circuit voltage and high frequency resistance. The battery state of charge (SOC) is derived from the open circuit voltage. Next, the battery terminal voltage and current are re-sampled at a low sampling rate. Other battery parameters can be extracted from the low-rate sampled signals. Next, all of the battery parameters that were obtained from the two sampling rates are used together to predict battery power.

20 Claims, 2 Drawing Sheets

BATTERY STATE ESTIMATOR USING MULTIPLE SAMPLING RATES

BACKGROUND OF THE INVENTION

1. Field of the Invention

This invention relates generally to a method for estimating battery parameters that uses multiple sampling rates and, more particularly, a method for estimating battery parameters that uses two different sampling times where a battery terminal voltage and current are sampled at a high sampling rate to estimate the battery open circuit voltage (OCV) and high frequency resistance and the battery terminal voltage and current is re-sampled at a low sampling rate to estimate battery parameters that can be used to estimate battery power.

2. Discussion of the Related Art

Electric vehicles are becoming more and more prevalent. These vehicles include hybrid vehicles, such as the extended range electric vehicles (EREV) that combines a battery and a main power source, such as an internal combustion engine, fuel cell systems, etc., and electric only vehicles, such as the battery electric vehicles (BEV). All of these types of electric vehicles employ a high voltage battery that includes a number of battery cells. These batteries can be different battery types, such as lithium ion, nickel metal hydride, lead acid, etc. A typical high voltage battery for an electric vehicle may include 196 battery cells providing about 400 volts of power. The battery can include individual battery modules where each battery module may include a certain number of battery cells, such as twelve cells. The individual battery cells may be electrically coupled in series, or a series of cells may be electrically coupled in parallel, where a number of cells in the module are connected in series and each module is electrically coupled to the other modules in parallel. Different vehicle designs include different battery designs that employ various trade-offs and advantages for a particular application.

Batteries play an important role in powering electrical vehicles and hybrid vehicles. The effectiveness of battery control and power management is essential to vehicle performance, fuel economy, battery life and passenger comfort. For battery control and power management, two states of the battery, namely, state of charge (SOC) and battery power, need to be predicted, or estimated, and monitored in real time because they are not measurable during vehicle operation. Battery state of charge and battery power can be estimated using a simple equivalent circuit model of the battery that defines the battery open circuit voltage (OCV), battery ohmic resistance and an RC pair including a resistance and a capacitance using the battery terminal voltage and current. Therefore, both battery states have to be derived from battery parameters estimated from the battery terminal voltage and current. A few battery state estimation algorithms have been developed in the art using different methodologies and some have been implemented in vehicles.

It is well known that battery dynamics are generally non-linear and highly dependent on battery operating conditions. However, for onboard battery parameter estimation, a linear model with a few frequency modes is used to approximate a battery's dominant dynamics for a specific application, such as power prediction or SOC estimation. The reason for this is mainly due to limited computational power and memory available for onboard applications. In fact, even if there were unlimited computational power and memory, the accurate estimation of all battery parameters in a complex model with as many frequency modes as possible cannot be guaranteed because the excitation of signals, normally battery terminal voltage and terminal current, is limited. Therefore, it is neither practical nor necessary to cover all frequency modes in one model as long as the estimation error caused by model uncertainties is within an acceptable range for a specific application.

In order to minimize the memory and computational cost, a battery model that is as simple as possible is highly preferred. On the other hand, different applications need to be characterized by different frequency modes. For instance, the feature frequency to characterize the high frequency resistance of the battery is much higher than the feature frequency that characterizes the change in battery power. A simple model with limited frequency modes inevitably introduces errors and uncertainties because it cannot fully cover all feature frequencies for various applications.

U.S. patent application Ser. No. 11/867,497, filed Oct. 4, 2007, now published as Publication No. U.S. 2009/0091299, titled Dynamically Adaptive Method For Determining The State of Charge of a Battery, assigned to the assignee of this invention and herein incorporated by reference, discloses a method for determining battery state of charge and battery power using four battery parameters, namely, the battery OCV, ohmic resistance, and the resistance and capacitance of an RC pair.

The currently existing battery state estimation algorithms are based on a single sampling rate. Without adding more dynamic components, i.e., additional frequency modes, into the battery model, these algorithms have difficulties capturing both fast dynamics for SOC estimation and slow dynamics for power prediction. Therefore, the accuracy and robustness of the algorithms are compromised for multiple applications. In other words, the sampling rate that measures the battery terminal voltage and current is generally too fast to accurately determine the parameters generated from the RC pair, which results in a somewhat inaccurate representation of the battery's power capabilities at any given point in time.

SUMMARY OF THE INVENTION

In accordance with the teachings of the present invention, a method is disclosed for estimating vehicle battery parameters that uses two different sampling rates. The method samples a battery terminal voltage and current at a high sampling rate to estimate the battery open circuit voltage and high frequency resistance. The battery state of charge (SOC) is derived from the open circuit voltage. Next, the battery terminal voltage and current are re-sampled at a low sampling rate. Other battery parameters can be extracted from the low-rate sampled signals. Next, all of the battery parameters that were obtained from the two sampling rates are used together to predict battery power.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for estimating battery parameter using two different sampling rates is merely exemplary in nature, and is in no way intended to limit the invention or its applications or uses. For example, the invention has particular application for an on-board algorithm for in-vehicle applications. However, as will be appreciated by those skilled in the art, the battery state estimator of the invention will have other applications other than vehicle applications.

The present invention proposes a new battery state estimator that uses multiple sampling rates and a simple battery model with limited frequency modes, but which emphasizes different feature frequencies for different applications. This battery state estimation method significantly improves the robustness and accuracy for SOC estimation and power prediction, without introducing a significant amount of additional computation and memory usage.

Figure 1:
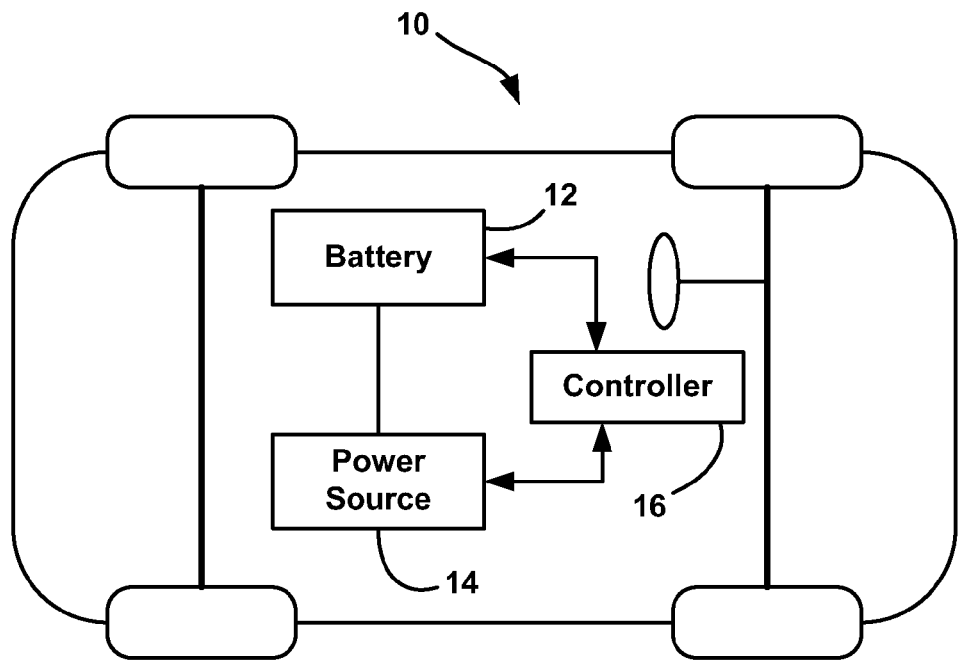
FIG. 1 is a simplified plan view of a hybrid vehicle including a battery and a main power source.

FIG. 1 is a simplified plan view of a vehicle 10 including a high voltage battery 12 and a main power source 14, and is intended to represent any hybrid vehicle, such as hybrid internal combustion engine, fuel cell system, etc. The vehicle 10 is also intended to represent any electric only vehicle that only employs a battery as the lone power source. The vehicle 10 includes a controller 16 that is intended to represent all of the control modules and devices necessary for the proper operation of the power provided by the battery 12 and the power source 14 to drive the vehicle 10, recharge the battery 12 by the power source 14 or regenerative braking, and determine the battery SOC and power capability as discussed below.

Figure 2:
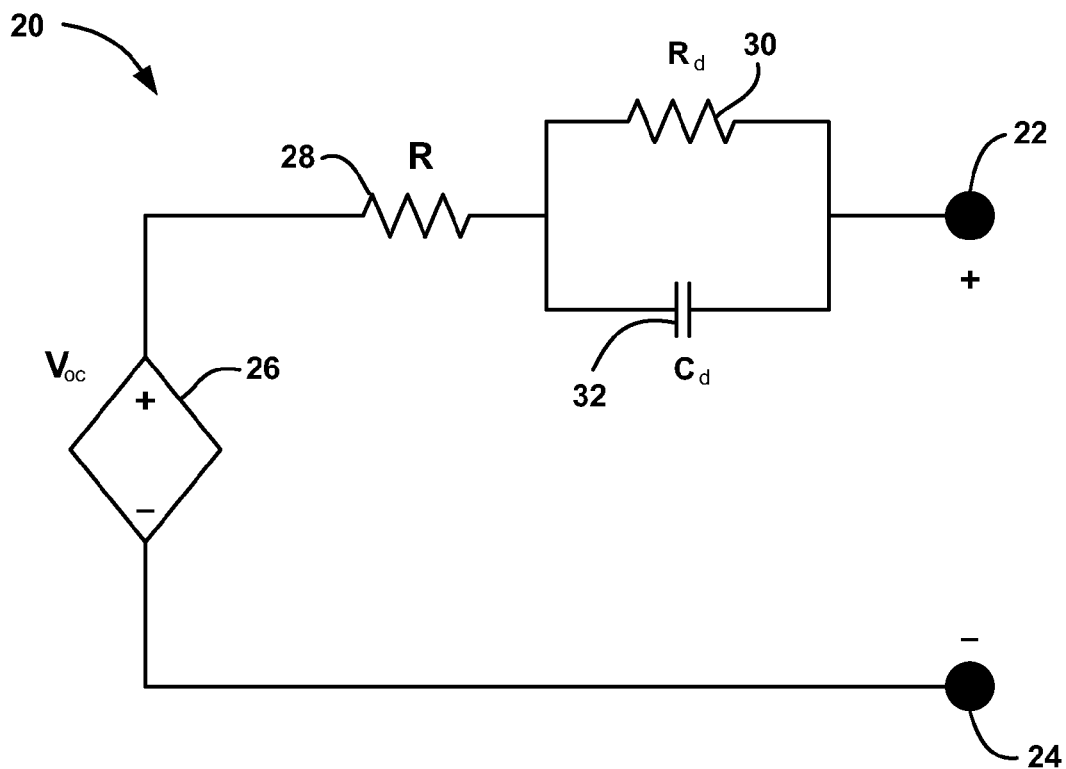
FIG. 2 is a schematic diagram of an RC-pair equivalent battery circuit.

FIG. 2 is a schematic diagram of a one RC-pair equivalent circuit 20 that is a simple battery model. The circuit 20 includes a positive terminal 22 and a negative terminal 24 defining an open circuit voltage (OVC) $V_{oc}$ at 26. The circuit 20 includes a resistance R identified at 28 in series with an RC pair including resistor $R_d$ identified at 30 and capacitance $C_d$ identified at 32. The equivalent circuit 20 is providing here as merely exemplary for a simplified equivalent circuit. Other battery models may use more complicated equivalent circuits, which may be applicable to be used in the discussion below for determining the various values.

The algorithm discussed herein employs a regression of the terminal voltage and current to estimate the open circuit voltage (OCV) and the ohmic resistance R, i.e., the high frequency resistance, of the circuit 20 at a high sampling rate. The battery SOC is then determined from the OCV by a look-up table. Next, the OCV and the potential over the ohmic resistance R are subtracted from the terminal voltage. The remaining voltage is further regressed to obtain other battery parameters. This regression is operated at a low sampling rate to capture the slow dynamics of the battery 12. It is desirable to reduce the sampling time to determine the parameters for estimating battery power because the higher sampling rate that is appropriate to determine the battery open circuit voltage and ohmic resistance R is not capable of accurately capturing the battery dynamics using the simplified equivalent circuit 20 because the circuit 20 cannot cover all scenarios between the sampling points and there is a possibility of parameter drifting. These battery parameters are combined with the OCV and the ohmic resistance R to predict the battery power. The technique for determining the open circuit voltage and the resistance R at the high sampling rate discussed above is detailed in the '497 application, and the technique for determining the open circuit voltage and the ohmic resistance R at the high sampling rate and the RC pair resistance $R_d$ and capacitance $C_d$ at the low sampling rate is detailed below.

For the one RC-pair equivalent circuit 20, the battery terminal voltage includes three components, which can be expressed as:

$$V(kT_1)=V_{oc}+I(kT_1)R+V_d(kT_1) \quad (1)$$

Where $T_1$ is the fast sampling time, k=1, 2, 3, ..., V is the measured battery terminal voltage, I is the measured battery terminal current, $V_{oc}$ is the open-circuit voltage, R is the ohmic resistance, $V_d$ is voltage across the RC pair, and $kT_1$ implies the time instant. Normally the sampling time $T_1$ is chosen based on the highest sampling rate that is available for onboard vehicle estimation. For example, if the highest available sample rate is 10 Hz, the sampling time $T_1$ can be 0.1 s.

The voltage $V_d$ can further dynamically be described by the following backward-difference formulation, i.e., the current I is evaluated at time $(k-1)T_1$.:

$$V_d(kT_1) = \exp\left(-\frac{T_1}{R_{d1}C_{d1}}\right)V_d((k-1)T_1) + R_{d1}\left(1-\exp\left(-\frac{T_1}{R_{d1}C_{d1}}\right)\right)I((k-1)T_1) \quad (2)$$

where $R_{d1}$ and $C_{d1}$ are the resistance and capacitance, respectively, that models the battery dynamic behavior under the sampling time $T_1$. While a backward-difference formulation is reflected in equation (2), a forward-difference where the current I is evaluated at time $kT_1$, and central difference where the current I is evaluated as time $I(kT_1)+I((k-1)T_1))/2$, methods can be employed as well to yield similar expressions.

In the format of a first-order differential equation, the battery dynamics can be described by combining equations (1) and (2) as:

$$V(kT_1)=\theta_1+\theta_2V((k-1)T_1)+\theta_3I(kT_1)+\theta_4I((k-1)T_1) \quad (3)$$

where $\theta_1$, $\theta_2$, $\theta_3$ and $\theta_4$ are coefficients and defined are as:

$$\theta_1=(1-\exp[-T_1/(R_{d1}C_{d1})])V_{oc} \quad (4)$$

$$\theta_2=\exp[-T_1/(R_{d1}C_{d1})] \quad (5)$$

$$\theta_3=R \quad (6)$$

$$\theta_4=(1-\exp[T_1/(R_{d1}C_{d1})])R_{d1} \quad (7)$$

Various estimation methods, such as a recursive least squares method, can be applied to equation (3) to obtain the coefficients $\theta_1$, $\theta_2$, $\theta_3$, $\theta_4$. As a result, the OCV and ohmic resistance R can be derived by:

$$V_{oc}=\theta_1/(1-\theta_2) \quad (8)$$

$$R=\theta_3 \quad (9)$$

Hence, the battery SOC can be derived from the OCV based on their one-to-one map relationship. In particular, the open circuit voltage and the battery temperature are used in a look-up table to determine the battery SOC.

The feature frequency of the battery power is usually around 1 Hz-2 Hz, which is much lower than $1/T_1$. The voltage and current terminal data is thus re-sampled with a sampling time $T_2>T_1$, i.e., the sampling time $T_2$ is much slower than the sampling time $T_1$, in order to achieve an accurate power prediction. The re-sampled voltage $V_d$ is given by:

$$V_d(kT_2)=(V(kT_2)-V_{oc}-I(kT_2)R) \quad (10)$$

where $V_{oc}$ and R are obtained as above.

Similar to equation (2), the dynamics of the RC pair under the sampling time $T_2$ can be described as:

$$V_d(kT_2) = \mu_1 V_d((k-1)T_2) + \mu_2 I((k-1)T_2) \quad (11)$$

Where $\mu_1$ and $\mu_2$ are coefficients defined by:

$$\mu_1 = \exp\left(-\frac{T_2}{R_d C_d}\right) \quad (12)$$

$$\mu_2 = R_d\left(1 - \exp\left(-\frac{T_2}{R_d C_d}\right)\right) \quad (13)$$

and, $R_d$ and $C_d$ are the RC pair resistance and capacitance under the sampling time $T_2$.

Similar regression methods can be used to estimate $\theta_1$, $\theta_2$, $\theta_3$, $\theta_4$ as was done above to estimate $\mu_1$ and $\mu_2$. Further, $R_d$ and $C_d$ can be derived as:

$$R_d = \frac{\mu_2}{1 - \mu_1} \quad (14)$$

$$C_d = \frac{T_2}{R_d \ln(\mu_1)} \quad (15)$$

Thus, the four parameters $V_{oc}$, R, $R_d$ and $C_d$ are estimated from the battery terminal voltage and current, where $V_{oc}$ and R are obtained at the high sampling time $T_1$ and $R_d$ and $C_d$ are obtained at the low sampling time $T_2$. Based on the above description, the battery voltage and current are regressed twice at different sample rates to obtain the parameters $V_{oc}$, R, $R_d$ and $C_d$. Among the four parameters, the values $V_{oc}$ and R represent the static property of the battery 12 and $V_{oc}$ is used to infer the SOC. The other two parameters $R_d$ and $C_d$ represent a dynamic behavior, which is related to the change of power. All four of these parameters are used to predict the battery discharge power based on the following equation:

$$P(t) = \frac{V_{min}(V_{oc} - V_{min})}{R + R_d} + V_{min}\left(\frac{V_{min} - V(kT_2)}{R} + \frac{(V_{min} - V_{oc})}{R + R_d}\right)\exp\left(-\frac{R + R_d}{RR_d C_d}t\right) \quad (16)$$

where $V(kT_2)$ is the terminal voltage of the present time, $V_{min}$ is the minimum value of the terminal voltage to be allowed, and $t > 0$ is set to predict the maximum power in the next t seconds. For example, the two-second power prediction at time $kT_2$ can be derived from equation (9) with $t = 2$. An analogous expression results for charge power prediction where the charge power prediction corresponds to equation (16) with $V_{min}$ replaced by $(V_{max})$ and the resulting expression is multiplied by −1.

Figure 3:
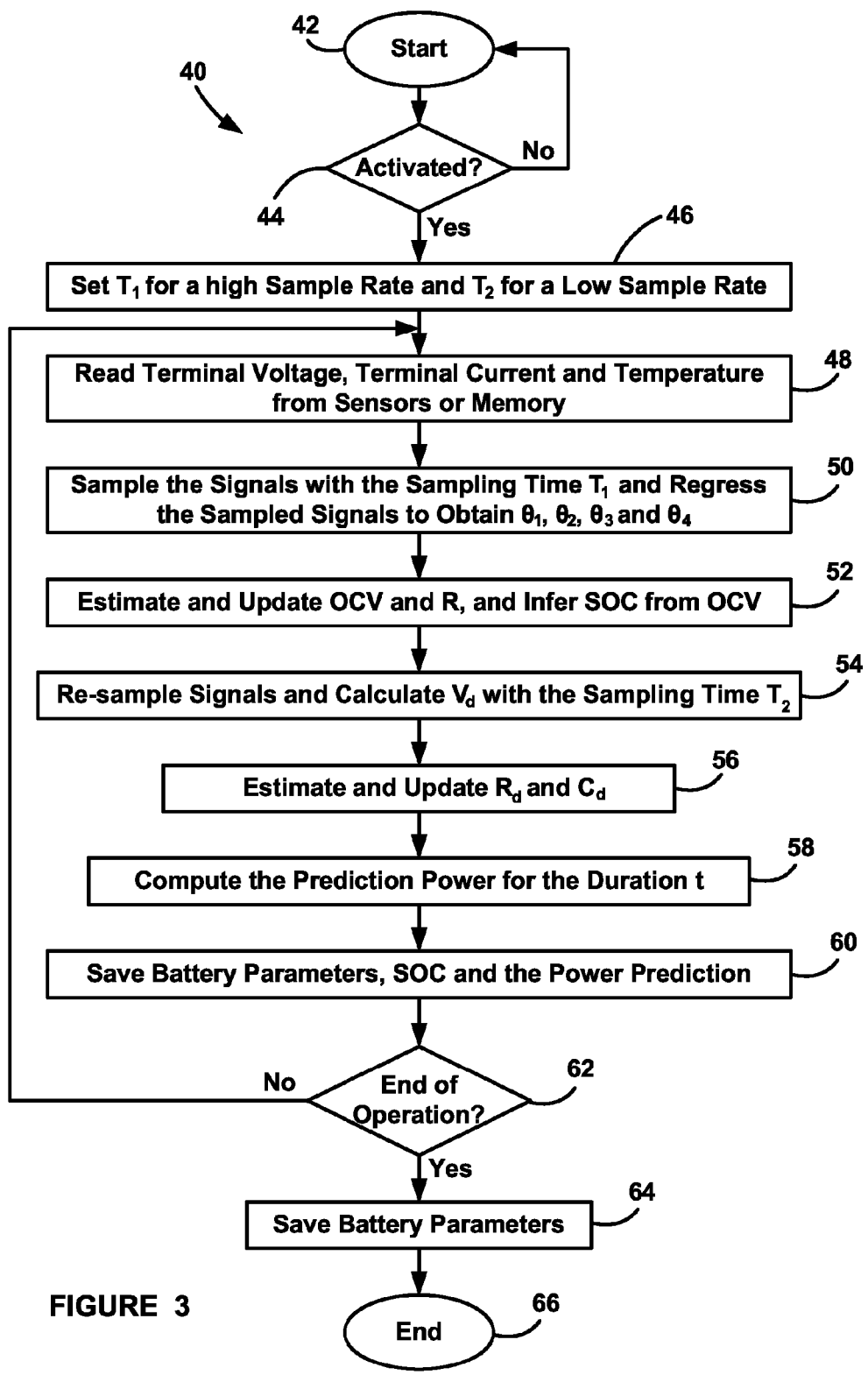
FIG. 3 is a flow chart diagram for an algorithm used in a method for estimating battery parameter.

This process can be illustrated by algorithm steps in a flow chart diagram 40 shown in FIG. 3. The algorithm is started at oval 42, which determines whether the vehicle system has been keyed on or activated at decision diamond 44. If the algorithm has been keyed on or activated, then initial values for the algorithm are set. Once the algorithm is activated, the algorithm sets the sampling time $T_1$ for the high sample rate and the sampling time $T_2$ for the low sample rate at box 46. The algorithm then provides the terminal voltage, the terminal current and the temperature of the battery 12 from sensors or memory at box 48. The battery temperature is necessary to determine the battery state of charge using the open circuit voltage.

The algorithm then samples the battery terminal voltage, the terminal current and the battery temperature at the high sampling rate $T_1$ at box 50. The algorithm uses the process discussed above, particularly equations (1)-(7), to regress the sampled signals and to obtain the coefficients $\theta_1$, $\theta_2$, $\theta_3$ and $\theta_4$, also at the box 50. The algorithm then estimates or calculates the open circuit voltage $V_{oc}$ and the ohmic resistance R using equations (8) and (9), and infers the battery state of charge from the open circuit voltage $V_{oc}$ at box 52.

The algorithm then re-samples the terminal voltage, the terminal current and the battery temperature at the slower sampling time $T_2$ at box 54. The algorithm also subtracts the open circuit voltage $V_{oc}$ and IR from the re-sampled terminal voltage to obtain the voltage $V_d$ using equation (10) at the box 54. The algorithm then regresses the voltage $V_d$ and the re-sampled current to obtain the coefficients $\mu_1$ and $\mu_2$ and calculates the RC pair resistance $R_d$ and capacitance $C_d$ using equations (12) and (13) at box 56. The algorithm then uses the resistance and capacitance values $R_d$ and $C_d$ to determine or predict the battery power P using equation (16) for the time duration t at box 58. The algorithm then saves the battery parameters $V_{oc}$, R, $R_d$ and $C_d$, the state of charge and the power prediction value P at box 60, and determines whether the operation has ended at decision diamond 62. If the operation has not ended, i.e., the vehicle is off, at the decision diamond 62, then the algorithm returns to the box 48 to read the terminal voltage, terminal current and temperature of the battery 12 to estimate the parameters $V_{oc}$, R, $R_d$ and $C_d$ for the next time period. If the operation has ended at the decision diamond 62, then the battery parameters $V_{oc}$, R, $R_d$ and $C_d$ are stored in memory for the next cycle at box 64 and the process ends at oval 66.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining parameters of a battery, said method comprising:
    defining an equivalent circuit model of the battery that includes a battery open circuit voltage, a battery ohmic resistance and an RC pair including an RC pair voltage, an RC pair resistance and an RC pair capacitance;
    defining a first sampling rate and a second sampling rate where the first sampling rate is faster than the second sampling rate;
    sampling a battery terminal voltage, a battery terminal current and a battery temperature at the first sampling rate;
    defining a battery terminal voltage relationship;
    defining an RC voltage relationship;
    using the battery terminal voltage relationship and the RC pair voltage relationship to determine a battery dynamics relationship including a plurality of first coefficients;
    regressing the battery dynamics relationship to obtain the plurality of first coefficients;
    determining the battery open circuit voltage and the battery ohmic resistance using the plurality of first coefficients;
    determining the battery state of charge using the battery open circuit voltage and the sampled battery temperature;
    re-sampling the battery terminal voltage, the battery terminal current and the battery temperature at the second sampling rate;

re-calculating the RC pair voltage at the second sampling time;
regressing the re-calculated RC pair voltage to obtain a plurality of second coefficients;
estimating the RC pair resistance and capacitance using the plurality of second coefficients; and
determining a predicted power of the battery over a certain time period using the open circuit voltage, the ohmic resistance, the RC pair resistance and the RC pair capacitance.

2. The method according to claim 1 wherein the first sampling time is 0.1 seconds and the second sampling time is 1 second.

3. The method according to claim 1 wherein defining the battery terminal voltage relationship uses the equation:

$$V(kT_1)=V_{oc}+I(kT_1)R+V_d(kT_1)$$

where $T_1$ is the fast sampling rate, k=1, 2, 3, ..., V is the battery terminal voltage, I is the battery terminal current, $V_{oc}$ is the open circuit voltage, R is the ohmic resistance, $V_d$ is the voltage across the RC pair, and $kT_1$ is a time instant.

4. The method according to claim 1 wherein defining the RC pair voltage uses the equation:

$$V_d(kT_1) = \exp\left(-\frac{T_1}{R_{d1}C_{d1}}\right)V_d((k-1)T_1) + R_{d1}\left(1-\exp\left(-\frac{T_1}{R_{d1}C_{d1}}\right)\right)I((k-1)T_1)$$

where $V_d$ is the RC pair voltage, k is a time instant, $T_1$ is the first sampling rate, $R_{d1}$ is the RC pair resistance at the first sampling rate, $C_{d1}$ is the RC pair capacitance at the first sampling rate and I is the battery terminal current.

5. The method according to claim 1 wherein the battery dynamics relationship uses the equation:

$$V(kT_1)=\theta_1+\theta_2 V((k-1)T_1)+\theta_3 I(kT_1)+\theta_4 I((k-1)T_1)$$

where $\theta_1$, $\theta_2$, $\theta_3$ and $\theta_4$ are the plurality of first coefficients, V is the battery terminal voltage, k is a time instant, $T_1$ is the first sampling rate and I is the battery terminal current.

6. The method according to claim 5 wherein the plurality of first coefficients are defined by the equations:

$$\theta_1=(1-\exp[-T_1/(R_{d1}C_{d1})])V_{oc}$$

$$\theta_2=\exp[-T_1/(R_{d1}C_{d1})]$$

$$\theta_3=R$$

$$\theta_4=(1-\exp[T_1/(R_{d1}C_{d1})])R_{d1}$$

where $R_{d1}$ is the RC pair resistance at the first sampling rate, $C_{d1}$ is the RC pair capacitance at the first sampling rate, $V_{oc}$ is the open circuit voltage and R is the ohmic resistance.

7. The method according to claim 6 wherein determining the battery open circuit voltage and ohmic resistance using the plurality of first coefficients includes using the equations:

$$V_{oc}=\theta_1/(1-\theta_2)$$

$$R=\theta_3.$$

8. The method according to claim 1 wherein determining the battery state of charge includes using a look-up table.

9. The method according to claim 1 wherein obtaining the plurality of second coefficients includes using the equations:

$$\mu_1 = \exp\left(-\frac{T_2}{R_d C_d}\right)$$

$$\mu_2 = R_d\left(1 - \exp\left(-\frac{T_2}{R_d C_d}\right)\right)$$

where $\mu_1$ and $\mu_2$ are the second coefficients, $T_2$ is the second sampling rate, $R_d$ is the RC pair resistance and $C_d$ is the RC pair capacitance.

10. The method according to claim 1 wherein estimating the RC pair resistance and capacitance includes using the equations:

$$R_d = \frac{\mu_2}{1-\mu_1}$$

$$C_d = \frac{T_2}{R_d \ln(\mu_1)}$$

where $R_d$ is the RC pair resistance, $C_d$ is the RC pair capacitance, $T_2$ is the second sampling rate, and $\mu_1$ and $\mu_2$ are the second coefficients.

11. The method according to claim 1 wherein determining the predicted battery power includes using the equation:

$$P(t) = \frac{V_{min}(V_{oc}-V_{min})}{R+R_d} + V_{min}\left(\frac{V_{min}-V(kT_2)}{R} + \frac{(V_{min}-V_{oc})}{R+R_d}\right)\exp\left(-\frac{R+R_d}{RR_d C_d}t\right)$$

where P is the predicted discharge power, $V_{oc}$ is the open circuit voltage, R is the opening resistance, $R_d$ is the RC pair resistance, $C_d$ is the RC pair capacitance, $T_2$ is the second sampling rate, V is the terminal voltage, $V_{min}$ is the minimum value of the terminal voltage to be allowed, and t>0 is set to predict the maximum discharge power in the next t seconds.

12. The method according to claim 1 wherein the battery is a lithium-ion battery.

13. The method according to claim 1 wherein the battery is a vehicle battery.

14. A method for determining parameters of a battery, said method comprising:
defining an equivalent circuit model of the battery that includes a battery open circuit voltage, a battery ohmic resistance and an RC pair including an RC pair resistance and an RC pair capacitance;
defining a first sampling rate and a second sampling rate where the first sampling rate is faster than the second sampling rate;
sampling a battery terminal voltage and a battery terminal current at the first sampling rate;
determining a battery open circuit voltage and a battery ohmic resistance using the battery terminal voltage and the battery terminal current sampled at the first sampling rate;
resampling the battery terminal voltage and the battery terminal current at the second sampling rate; and
using the resampled battery terminal voltage and battery terminal current to determine the RC pair resistance and the RC pair capacitance.

15. The method according to claim 14 further comprising determining a predicted power of the battery over a certain time period using the open circuit voltage, the ohmic resistance, the RC pair resistance and the RC pair capacitance.

16. The method according to claim 14 wherein determining the open circuit voltage and the ohmic resistance includes using a battery terminal voltage relationship and an RC pair voltage relationship to determine a battery dynamics relationship including a plurality of coefficients, regressing the battery dynamics relationship to obtain the plurality of coefficients and determining the battery open circuit voltage and the battery ohmic resistance using the plurality of coefficients.

17. The method according to claim 14 wherein determining the RC pair resistance and capacitance includes calculating an RC pair voltage at a second sampling time and regressing the RC pair voltage to obtain a plurality of coefficients and estimating the RC pair resistance and capacitance using the plurality of coefficients.

18. The method according to claim 14 wherein the battery is a lithium-ion battery.

19. A method for determining parameters of a battery, said method comprising:
defining an equivalent circuit model of the battery that includes a battery open circuit voltage, a battery ohmic resistance and an RC pair including an RC pair resistance and an RC pair capacitance;
defining a first sampling rate and a second sampling rate where the first sampling rate is faster than the second sampling rate;
sampling a battery terminal voltage and a battery terminal current at the first sampling rate;
determining a battery open circuit voltage and a battery ohmic resistance using the battery terminal voltage and the battery terminal current sampled at the first sampling rate including using a battery terminal voltage relationship and an RC pair voltage relationship to determine a battery dynamics relationship including a plurality of coefficients, regressing the battery dynamics relationship to obtain the plurality of coefficients and determining the battery open circuit voltage and the battery ohmic resistance using the plurality of coefficients;
resampling the battery terminal voltage and the battery terminal current at the second sampling rate; and
using the resampled battery terminal voltage and battery terminal current to determine the RC pair resistance and the RC pair capacitance including calculating an RC pair voltage at a second sampling time and regressing the RC pair voltage to obtain a plurality of coefficients and estimating the RC pair resistance and capacitance using the plurality of coefficients.

20. The method according to claim 19 further comprising determining a predicted power of the battery over a certain time period using the open circuit voltage, the ohmic resistance, the RC pair resistance and the RC pair capacitance.

* * * * *